(12) United States Patent
Tessnow et al.

(10) Patent No.: US 6,851,837 B2
(45) Date of Patent: Feb. 8, 2005

(54) STACKABLE LED MODULES

(75) Inventors: Thomas Tessnow, Weare, NH (US); Kim M. Albright, Warner, NH (US)

(73) Assignee: OSRAM Sylvania Inc., Danvers, MA (US)

(*) Notice: Subject to any disclaimer, the term of this patent is extended or adjusted under 35 U.S.C. 154(b) by 92 days.

(21) Appl. No.: 10/309,966

(22) Filed: Dec. 4, 2002

(65) Prior Publication Data

US 2004/0109315 A1 Jun. 10, 2004

(51) Int. Cl.[7] ............................. B60Q 3/04; F21V 15/00
(52) U.S. Cl. ....................... 362/362; 362/800; 362/226; 362/249; 362/373; 362/391
(58) Field of Search ................................. 362/362, 800, 362/226, 249, 373, 391; 257/676; 439/110, 115, 114

(56) References Cited

U.S. PATENT DOCUMENTS

| | | | | |
|---|---|---|---|---|
| 3,638,009 A | * | 1/1972 | Strianese | 362/293 |
| 3,755,661 A | * | 8/1973 | Bouvrande | 362/253 |
| 3,831,130 A | * | 8/1974 | Valtonen | 439/115 |
| 4,260,963 A | * | 4/1981 | Drapac | 333/26 |
| 4,308,572 A | * | 12/1981 | Davidson et al. | 362/103 |
| 4,855,882 A | | 8/1989 | Boss | |
| 5,045,981 A | | 9/1991 | Nagano | |
| 5,323,271 A | * | 6/1994 | Shimada | 359/845 |
| 5,381,309 A | * | 1/1995 | Borchardt | 362/31 |
| 5,490,048 A | | 2/1996 | Brassier | |
| 5,559,681 A | | 9/1996 | Duarte | |
| 5,567,037 A | | 10/1996 | Ferber | |
| 5,672,000 A | | 9/1997 | Lin | |
| 5,785,411 A | | 7/1998 | Komai | |
| 5,829,865 A | | 11/1998 | Ahroni | |
| 5,857,767 A | * | 1/1999 | Hochstein | 362/294 |
| 5,931,577 A | | 8/1999 | Ishibashi | |
| 6,135,615 A | | 10/2000 | Lee | |
| 6,394,626 B1 | | 5/2002 | McColloch | |
| 6,573,536 B1 | * | 6/2003 | Dry | 257/88 |

FOREIGN PATENT DOCUMENTS

JP          05012912 A    *   1/1993   ........... F21V/29/00

* cited by examiner

Primary Examiner—Stephen Husar
Assistant Examiner—Sharon Payne
(74) Attorney, Agent, or Firm—William E. Meyer

(57) ABSTRACT

A solid-state lighting system (10) has a carrier (12 or 12a) having at least two electrically conductive traces (14, 16) thereon; and at least one module (18) carrying at least one solid-state light source (20) mounted with the carrier. The module (18) has electrical conductors (22, 24) in contact with the electrically conductive traces (14, 16) on the carrier. The carrier (12 or 12a) is elongated and the at least one module (18) has a horizontal aperture (26) therethrough with the electrical conductors (22, 24) extending at least into the aperture. The module (18) is slidably mounted upon the carrier (12 or 12a) with the carrier penetrating the horizontal aperture (26) and the electrical conductors (22, 24) in engagement with the electrical traces (14, 16).

8 Claims, 3 Drawing Sheets

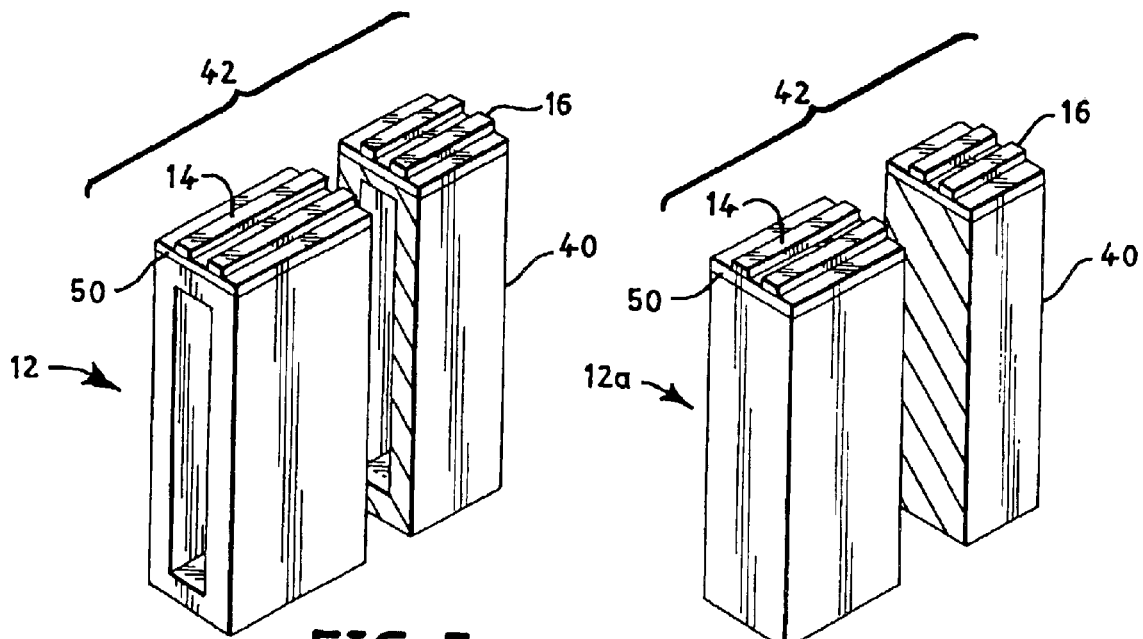
FIG. 5
FIG. 6
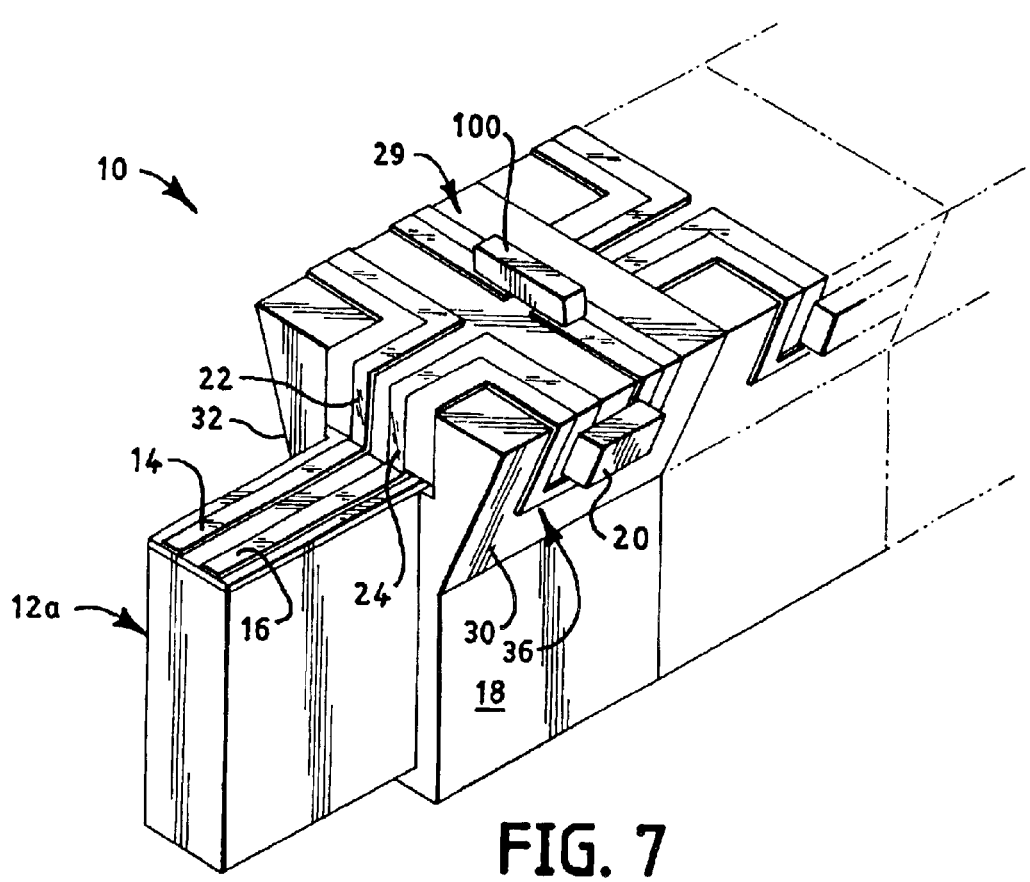
FIG. 7

STACKABLE LED MODULES

TECHNICAL FIELD

This invention relates to solid-state light sources and more particularly solid-state lighting systems. Still more particularly it relates to solid-state lighting systems including a carrier on which multiple modules can be placed, allowing light sources of variable length to be constructed with ease.

BACKGROUND ART

Solid-state lighting devices, such as light emitting diodes (hereafter, LEDs) provide many advantages over conventional filamented or arc discharge light sources, among these being long life, relatively cool operation and a degree of ruggedness not available in, for example, filamented lamps. In the desire to standardize LED systems most approaches have tried to simulate traditional concepts similar to incandescent lamps or arc discharge sources such as by putting the LED into circular or elliptical reflectors. This approach limits the design flexibility to a central source in a reflector and limits the size of the source and of the reflector. Other approaches, such as that shown in U.S. Pat. No. 5,672,000 have applied a modular technique; however, these attempts have employed multi-part modules which have a tendency to separate during use.

DISCLOSURE OF INVENTION

It is, therefore, an object of the invention to obviate the disadvantages of the prior art.

It is another object of the invention to enhance the use of solid-state light sources.

Still another object of the invention is the provision of a solid-state lighting system that is stackable, composed of a minimal number of pieces and conveniently manufacturable in variable lengths.

These objects are accomplished, in one aspect of the invention, by the provision of a solid-state lighting system that comprises a carrier having at least two electrically conductive traces thereon and at least one module carrying at least one solid-state light source mounted with the carrier. The module has electrical conductors in contact with the electrically conductive traces on the carrier.

In a preferred embodiment, the carrier is elongated and the at least one module has an aperture therethrough with the electrical conductors extending at least into the aperture. The module is slidably mounted upon the carrier with the carrier penetrating the aperture and the electrical conductors in engagement with the electrical traces.

This lighting system has few parts and the single piece construction of the module insures a permanent placement.

BRIEF DESCRIPTION OF THE DRAWINGS

FIG. 5 is a perspective view of an embodiment of a carrier that can be used with the invention;

FIG. 6 is a perspective view of another embodiment of a carrier; and

FIG. 7 is a perspective view of a solid-state lighting system.

BEST MODE FOR CARRYING OUT THE INVENTION

For a better understanding of the present invention, together with other and further objects, advantages and capabilities thereof, reference is made to the following disclosure and appended claims in conjunction with the above-described drawings.

Figure 1:
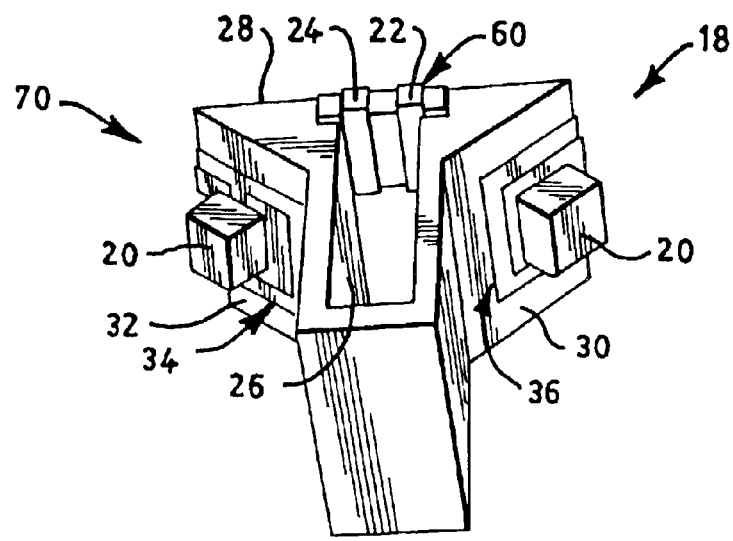
FIG. 1 is a perspective view of a module.
Figure 2:
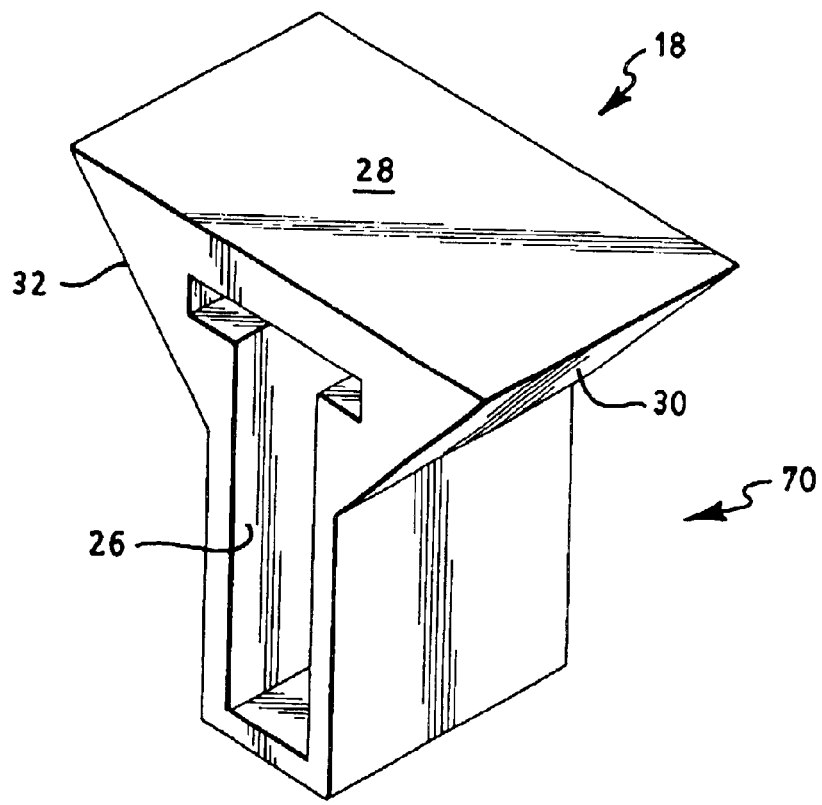
FIG. 2 is a perspective view of a module without its accompanying circuitry.

Referring now to the drawings with greater particularity, there is shown in FIG. 1 a module 18 for a solid-state lighting system 10 (see FIG. 7) that comprises a body 70 with an aperture 26 therethrough and a planar surface 28 on the body 70 that carries a printed circuit board 60 having electrical conductors 22, 24 thereon. The electrical conductors 22, 24 extend into the aperture 26. Module 18 has two sides, 30 and 32 that depend from planar surface 28 at an angle of less than 90°. FIG. 2 is a perspective view of a module without its accompanying circuitry. Module 18, may also be U shaped with frictional or snap inplace features on the inside of the arms of the U or the bar 42 so that module 18 may be clipped onto the bar 42.

Figure 3:
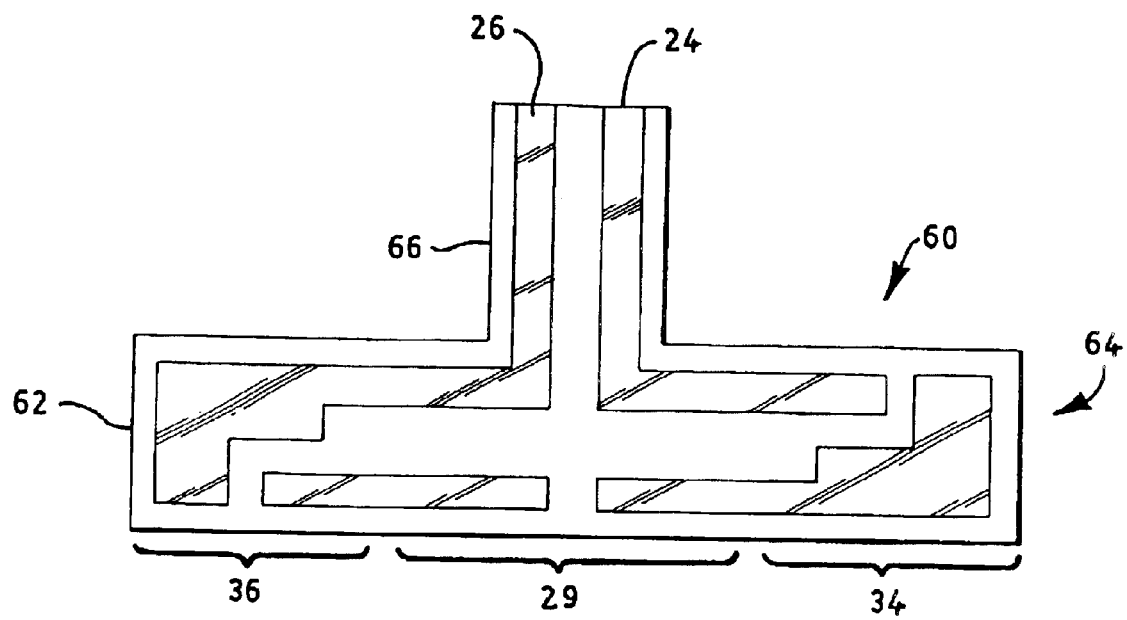
FIG. 3 is a plan view of a flexible printed circuit board useable with the invention.
Figure 4:
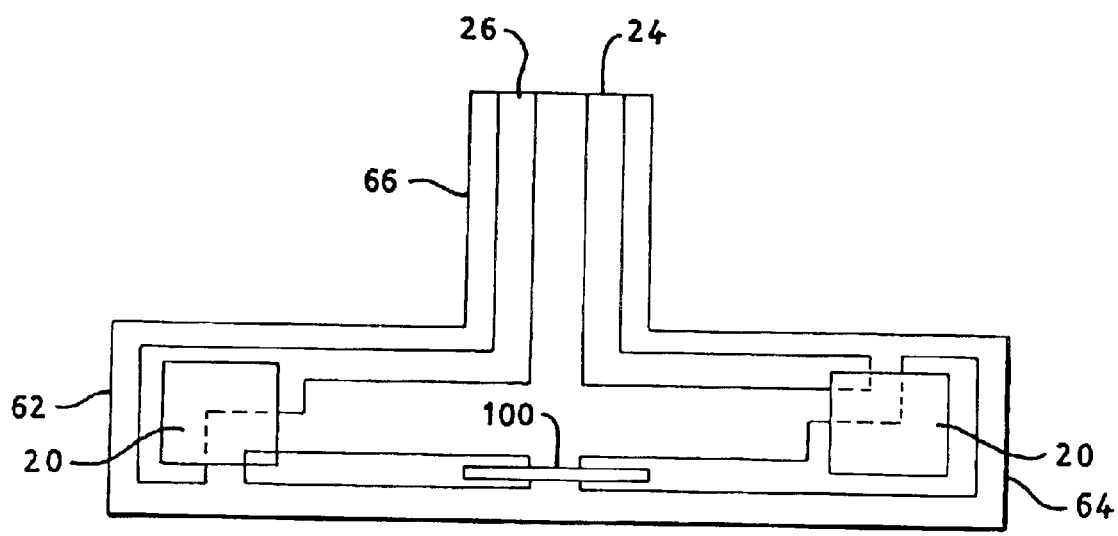
FIG. 4 is a view similar to FIG. 3 but with solid-state light sources positioned thereon.

The printed circuit board 60, which is flexible, is shown more clearly in FIGS. 3 and 4, and in this preferred embodiment is substantially T-shaped having projecting ends 62, 64 with a centrally located stem 66. A light source 20, which can be a light emitting diode (LED) is operatively affixed at each of the ends 62, 64 and a resistor 100 can be added if necessary. In a preferred embodiment, light sources 20 and the resistor 100 are affixed to the printed circuit board 60 while it is planar so that currently available pick and place machines can be used in the assembly. The board 60 is then affixed to the body 70 of module 18 by thermally conductive glue or adhesive tape and, as applied, has a first portion 29 adhered to planar surface 28 and second portions 34, 36 attached respectively to sides 30, 32. The stem 66 is bent around the edge of the module 18 so that the terminals of the electrical conductors 22, 24 extend into the aperture 26 as shown in FIG. 1.

Referring now to FIGS. 5 and 6, there is shown a carrier 12 comprising an elongated bar 42 formed from a thermally conductive material, for example, extruded aluminum. The carrier 12 can be hollow as shown in FIG. 3 or solid as shown at 12a in FIG. 6. Other materials can be employed so long as they meet the necessary thermal conductivity requirements of the light sources.

Whichever carrier 12, 12a is used, a surface is provided with electrically conductive traces 14 and 16 thereon insulated from the carrier by insulator 50.

The solid-state lighting system 10 is shown in FIG. 7. To complete the system 10 modules 18 are slid upon carrier 12a, in any desired number, so that the terminal ends of electrical conductors 22, 24 that extend within the aperture 26 are in electrical contact with the traces 14 and 16 fixed upon the carrier 12a. This system allows for the construction of solid-state light sources of virtually any length. The carriers 12 or 12a can be formed in any length and cut to the desired size when the system is assembled.

The construction of the modules 18 with a single-piece body greatly reduces the number of parts necessary and provides greater assurance of long term use without the possibility of electrical contact separation. The system is rugged and the use of flexible printed circuit boards reduces the need for soldering and additional wires.

While there have been shown and described what are at present considered to be the preferred embodiments of the invention, it will be apparent to those skilled in the art that various changes and modification can be made herein without departing from the scope of the invention as defined by the appended claims.

What is claimed is:

1. A solid-state lighting system comprising:

a carrier having at least two electrically conductive traces thereon; and at least one module carrying at least one solid-state light source mounted with said carrier, said module having electrical conductors in contact with said electrically conductive traces on said carrier wherein said carrier is elongated and said at least one module has a horizontal aperture therethrough with said electrical condutors extending at least into said aperture; said module being slidably mounted upon said carrier with said carrier penetrating said horizontal aperture and said electrical conductors in engagement with said electrical traces.

2. The solid-state lighting system of claim 1 wherein said module has a planar surface on which a portion of said electrical conductors are positioned.

3. The solid-state lighting system of claim 2 wherein said module has two sides depending from said planar surface at an angle less than 90°.

4. The solid-state lighting system of claim 3 wherein said two sides carry a second portion of said electrical conductors.

5. The solid-state lighting system of claim 4 wherein each of said second portions of said electrical conductors carries a solid-state light source.

6. The solid-state lighting system of claim 1, wherein said carrier comprises an elongated bar of thermally conductive material having at least two electrically conductive traces thereon.

7. The solid-state lighting system of claim 6 wherein said thermally conductive material is aluminum and said at least two electrically conductive traces are electrically insulated therefrom.

8. The solid-state lighting system.

* * * * *